United States Patent [19]

Russell

[11] 4,050,030
[45] Sept. 20, 1977

[54] OFFSET ADJUSTMENT CIRCUIT

[75] Inventor: Ronald W. Russell, Sunnyvale, Calif.

[73] Assignee: National Semiconductor Corporation, Santa Clara, Calif.

[21] Appl. No.: 699,776

[22] Filed: June 25, 1976

Related U.S. Application Data

[63] Continuation of Ser. No. 549,196, Feb. 12, 1975, abandoned.

[51] Int. Cl.² ............................ H03F 3/16; H03F 3/45
[52] U.S. Cl. ................................ 330/23; 330/30 D; 330/35
[58] Field of Search ............... 330/23, 30 D, 35, 38 M, 330/69

[56] References Cited

U.S. PATENT DOCUMENTS 3,742,377    6/1973    Dobkin ............................... 330/30 D Primary Examiner—James B. Mullins
Attorney, Agent, or Firm—Gail W. Woodward; Willis E. Higgins

[57] ABSTRACT

An offset adjustment circuit for a differential amplifier includes a current source connected in series with a resistor for establishing a biasing voltage for a pair of field effect transistors (FET) having variable resistors in their biasing circuits. These FET's are connected to introduce currents respective connections between an input stage and a second stage of the differential amplifier. The difference of the currents supplied by the FET's divided by the transconductance of the input stage of the differential amplifier corresponds to an offset which remains fixed with changes in temperature. The offset introduced by the FET's, as determined by the adjusted values of the resistors in their biasing circuits, may be in opposition to the offset of the differential amplifier to either reduce it partially or completely, or it may be additive to the offset of the differential amplifier, as desired.

5 Claims, 1 Drawing Figure

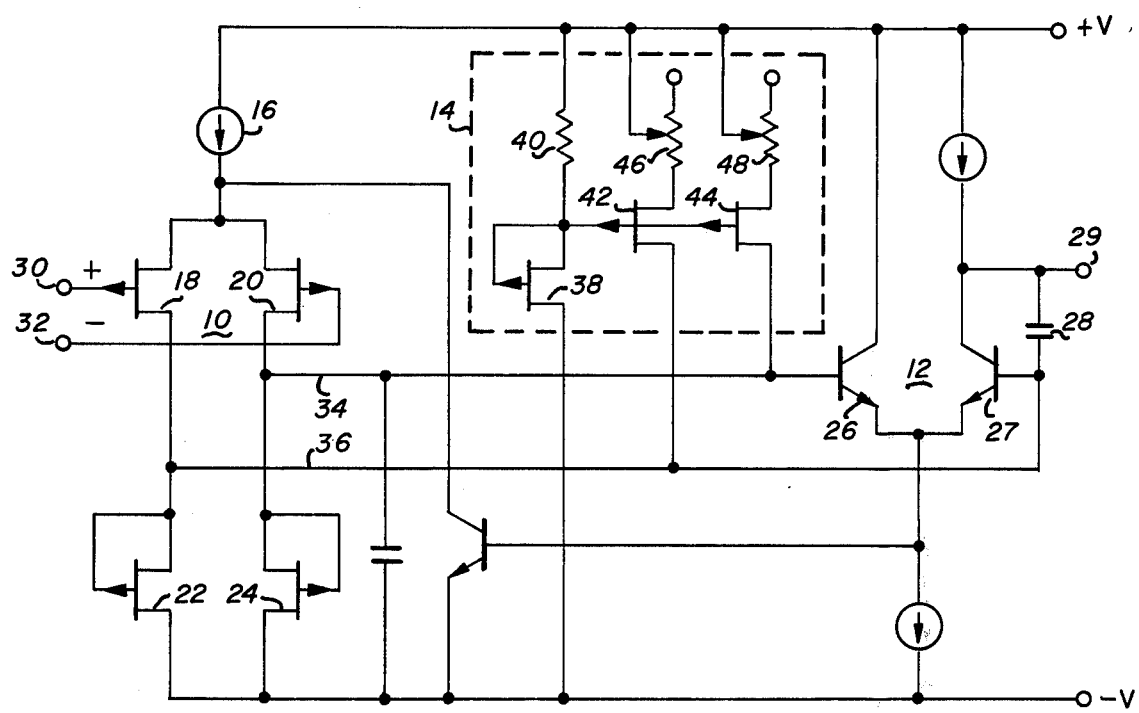

OFFSET ADJUSTMENT CIRCUIT

This is a continuation of application Ser. No. 549,196, filed 2/12/75 and now abandoned.

BACKGROUND OF THE INVENTION

1. Field of the Invention

This invention relates generally to amplifier circuits, and more particularly to an offset adjustable differential amplifier.

2. Prior Art

The offset voltage of a differential amplifier is one of the errors of that amplifier. The offset error voltage of a differential amplifier can be defined as the output voltage of the amplifier divided by its gain when the inputs of the amplifier are connected together. The offset of a differential amplifier is an imbalanced condition and may be the result of one or more of a variety of factors, such as mismatch of the input differential pair, mismatch of the current loads for the input differential pair, or unequal loading of the input stage, for example. Regardless of the cause of the offset voltage of a differential amplifier, however, its effect will produce a difference in the currents between the input stage and the second stage thereof, which difference will be proportional to the offset error voltage.

Although it may be possible to analyze individual differential amplifiers to determine the specific cause of its offset error voltage and to make a special offset adjusting circuit for each, this approach is not practical for monolithic circuits in which the specific cause of the offset error voltage of each circuit cannot be determined. Furthermore, problems may arise, as will be discussed below, when attempting to employ circuitry which is external to a monolithic circuit for adjusting the offset voltage of that monolithic circuit. Also, once a specific circuit has been designed as a large production monolithic circuit, it is desirable to include as many components of that circuit as possible within the monolithic circuit as internal components, rather than as external components.

Although a differential amplifier may have an offset error voltage, it may be desirable in some applications to adjust that offset voltage to a predetermined level, rather than to completely eliminate it. In the past, the offset voltage of a monolithic differential amplifier has been corrected by employing external circuitry to alter the difference in the currents in the differential amplifier in a direction and by an amount to provide the desired corrected offset voltage. If it is desired to reduce the offset voltage of a differential amplifier to zero, the difference in the currents in that differential amplifier are altered by such additional circuitry in a direction and by an amount sufficient to cancel the effect of the offset voltage. Generally, the temperature coefficient of such additional, external circuitry is different from the temperature coefficient of the internal components of the monolithic amplifier.

The offset error voltage of a differential amplifier is subject to drift with the changes in temperature. Prior known circuitry for adjusting the offset voltage of a differential amplifier is also subject to drift with the changes in temperature. The known prior art circuitry for adjusting the drift in a monolithic differential amplifier produces a drift of the amplifier output with changes in temperature which is substantially greater than the drift which would occur solely as a result of the original, unadjusted offset error voltage of that amplifier without the additional, external offset adjusting circuitry connected thereto. The drift produced as a result of the additional, external circuitry for adjusting the offset voltage results from the fact that the temperature coefficient of the external components is substantially different from the temperature coefficient of the internal components of the monolithic circuit being adjusted. That is, if a gross mismatch of the temperature coefficients of the internal and external components exists, a relatively large drift will result with changes in temperature.

An example of the above mentioned technique for correcting the offset error voltage of a differential amplifier includes the connection of a potentiometer between the differential input pair which can be varied to adjust the difference in currents between the input stage and the second stage thereof by an amount and in a direction to produce the desired amount of adjusted offset voltage. If desired, this potentiometer can be adjusted such that the difference in these currents will be equal to zero, thereby providing a zero offset voltage for the differential amplifier. In a monolithic circuit, such a potentiometer must be external to the amplifier circuit. Generally, the temperature coefficient of such a potentiometer is different than the temperature coefficient of the internal components of the monolithic differential amplifier, thereby resulting in drift of the adjusted offset voltage with changes in temperature.

Another example of offset error voltage adjustment circuitry for a differential amplifier includes an external circuit which is employed for forcing a change in one branch of a current mirror connected to the input differential pair of the amplifier. With changes in temperature, however, the adjusted offset voltage will drift, since the temperature coefficient of the external components is different from the temperature coefficient of the internal components.

Accordingly, it can be appreciated that a need exists for an offset adjustment circuit for a differential amplifier which will produce either no drift or a relatively low drift of the offset adjustment with temperature change.

SUMMARY OF THE INVENTION

It is, therefore, an object of the present invention to provide a differential amplifier with a circuit for adjusting the offset error voltage thereof, which circuit does not contribute any drift in that offset voltage as a result of a temperature change.

Another object of the present invention is to provide an offset adjusting circuit for a monolithic differential amplifier in which the temperature coefficients of the external components thereof are equal and the temperature coefficients of the internal components of the adjusting circuitry and the internal components of the differential amplifier are equal, such that temperature changes will not produce any greater drift in the output of the amplifier than that produced by the original offset voltage.

These and other objects of the present invention are attained by the provision of a circuit which is connected to the outputs of the input differential pair of a differential amplifier and produces currents, with the difference of such currents corresponding to an offset when reflected to the inputs of the differential amplifier. The difference between the currents supplied by the offset adjustment circuitry divided by the transconductance of the input stage of the differential amplifier is equivalent to an offset which may be either in opposition to the offset of the differential amplifier or may be additive therewith. This quotient of the difference between the currents supplied by the offset correction circuit and the transconductance of the differential amplifier remains fixed with changes of temperature.

Accordingly, it can be appreciated that the offset correction circuit of the present invention not only adjusts the original offset voltage of the differential amplifier, but does not contribute any drift in that original offset voltage due to a temperature change.

The invention, however, as well as other objects, features and advantages thereof will be more fully realized and understood from the following detailed description, when taken in conjunction with the accompanying drawing, wherein:

BRIEF DESCRIPTION OF THE DRAWING

The single FIGURE is a schematic diagram of an offset corrected differential amplifier constructed in accordance with the principles of the present invention.

DETAILED DESCRIPTION OF THE PREFERRED EMBODIMENT

With reference to the drawing in detail, there is shown a differential amplifier having an input stage which is generally designated with the reference numeral 10, a second and output stage which is generally designated with the reference numeral 12, and an offset correction circuit which is contained within the dotted line outline which is designed with the reference numeral 14. Although the offset correction circuit 14 is illustrated as being connected to a particular differential amplifier, it is to be understood that the offset correction circuit 14 may be employed with any differential amplifier if the characteristics of the components thereof are matched to the characteristics of the differential amplifier.

The input stage 10 of the differential amplifier includes a current source 16 connected between a positive supply voltage and a differential pair of field effect transistors (FET) 18 and 20. The gate electrodes of the FET's 18 and 20 form the inputs of the amplifier stage 10. FET current source loads 22 and 24 are connected between a respective one of the FET's 18 and 20 and the negative supply voltage. The outputs of the input amplifier stage 10 are connected to respective inputs of the output stage 12 which includes a differential pair of transistors 26 and 27. A capacitor 28 is connected between the base of the transistor 27 and an output terminal 29 of the differential amplifier and provides asymmetric frequency compensation therefor.

If the input terminals 30 and 32 are connected together, any offset voltage of the input stage 10 or any loading thereof will produce differential drain currents on output lines 34 and 36. If the base drive currents required to produce a zero output on the terminal 29 are subtracted from the drain currents into the bases of the transistors 26 and 27, the difference of the resulting current magnitudes will be equal to the product of the offset voltage of the differential amplifier and the transconductance of the input stage 10.

The offset correction circuit 14 includes an FET 38 having its gate and source connected together and through a resistor 40 to the positive supply voltage, thereby forming a current source. Accordingly, the voltage developed across the resistor 40 is proportional to the current through the FET 38.

The source of the FET 38 is connected to the gates of a pair of FET's 42 and 44 having their sources connected through variable resistors 46 and 48, respectively to the positive supply voltage. The drain of the FET 44 is connected to the output line 34 and the drain of the FET 42 is connected to the output line 36. The sum of the voltage drop across the resistor 46 and the source to gate voltage on the FET 42 is equal to the voltage drop developed across the resistor 40. In a like manner, the sum of the voltage drop across the resistor 48 and the source to gate voltage on the FET 44 is equal to the voltage drop developed across the resistor 40. Therefore, the current supplied to the output lines 34 and 36 from the offset correction circuit 14 can be controlled by adjusting the variable resistors 46 and 48.

The difference between the currents through the FET's 42 and 44 divided by the transconductance of the input stage 10 corresponds to an adjusting offset voltage. Accordingly, the currents through the FET's 42 and 44 can be adjusted by the variable resistors 46 and 48 to be either in opposition to the differential currents produced by the original offset voltage of the differential amplifier or can be adjusted to be additive to the differential currents produced by the original offset of the differential amplifier. If desired, the currents through the FET's 42 and 44 can be adjusted to cancel the effect of the differential currents produced by the original offset of the differential amplifier at its output 29. The sum of the adjusting offset voltage produced by the circuit 14 and the original offset voltage of the differential amplifier is equal to the total offset voltage of the entire circuit illustrated in the drawing. Accordingly, if the adjusting offset voltage is equal to the original offset voltage, but of opposite polarity thereto, the total offset voltage of the entire circuit will be equal to zero.

The temperature change which occurs after the resistors 46 and 48 are set, will change the transconductance of the input stage 10. Such a change in temperature will also change the conduction level of the FET 38. A change in the conduction level of the FET 38 will alter the bias on the FET's 42 and 44, such that the amplitude of their drain currents will also change. Any temperature change which tends to increase the transconductance of the input stage 10 also tends to increase the drain currents of the FET's 42 and 44 by an equal amount. Therefore, the adjusting offset voltage provided by the circuit 14 remains fixed with changes in temperature.

If the differential amplifier illustrated in the drawing is to be made as a monolithic circuit, the FET's 38, 42 and 44 would be included in that monolithic circuit and the resistors 40, 46 and 48 would be connected as external components to that monolithic circuit. Since the resistors 40, 46 and 48 can be easily obtained with the same temperature coefficient, there will be no drift due to a change in temperature if the resistors 40, 46 and 48 are matched components. Since the FET 38 is an internal component, its temperature coefficient will be matched with the temperature coefficient of the other internal FET's illustrated in the drawing and, therefore, there will be no drift as a result of a temperature change effecting the characteristics of the internal components of the monolithic circuit. It can be appreciated, therefore, that the only drift which will result in the circuit illustrated in the drawing is that which would occur for the original offset voltage without the circuit 14 connected to the differential amplifier. As previously mentioned, the drift resulting from the original offset voltage of a differential amplifier is considerably less than that which is produced by prior known offset correcting circuits. Also, if it is desired to establish a predetermined amount of offset voltage of the differential amplifier by adjusting the variable resistors 46 and 48, the drift of the amplifier with changes in temperature will be only that amount of drift which would have resulted from the original offset voltage of the differential amplifier without the circuit 14 connected thereto.

The invention claimed is:

1. In combination with a differential amplifier including an input stage and a second stage connected together by a pair of output lines having an offset error voltage, an offset voltage adjusting circuit, comprising:
   a. a current source;
   b. first means connected in series with said current source for developing a voltage drop thereacross; and
   c. a pair of transistors, each having their biasing circuits connected in parallel with said first means and having their outputs connected to respective ones of said output lines between said input stage and said second stage of said differential amplifier.

2. The offset voltage adjusting circuit of claim 1, wherein the temperature coefficient of said current source is substantially equal to the temperature coefficient of the components comprising said input stage.

3. The offset adjusting circuit of claim 1, further comprising second means connected to said transistors for altering the current through each.

4. The offset adjusting circuit of claim 1, wherein said transistors are field effect transistors (FET's).

5. The offset adjusting circuit of claim 4, wherein said first means includes a first resistor connected from a positive supply voltage to said current source and to the gate of each of said FET's, and further comprising a pair of variable resistors each connected from said positive supply voltage to the sources of respective ones of said FET's.

* * * * *